(12) United States Patent
Huang et al.

(10) Patent No.: US 11,456,210 B2
(45) Date of Patent: Sep. 27, 2022

(54) INTEGRATED CIRCUIT AND METHOD FOR MANUFACTURING THE SAME

(71) Applicant: TAIWAN SEMICONDUCTOR MANUFACTURING COMPANY LTD., Hsinchu (TW)

(72) Inventors: Kuan-Wei Huang, Taoyuan County (TW); Yi-Nien Su, Hsinchu (TW); Yu-Yu Chen, Hsinchu (TW); Jyu-Horng Shieh, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 63 days.

(21) Appl. No.: 17/070,305

(22) Filed: Oct. 14, 2020

(65) Prior Publication Data
US 2022/0115266 A1    Apr. 14, 2022

(51) Int. Cl.
*H01L 21/768*    (2006.01)
*H01L 23/532*    (2006.01)
*H01L 21/306*    (2006.01)

(52) U.S. Cl.
CPC .. *H01L 21/76832* (2013.01); *H01L 21/30625* (2013.01); *H01L 21/76843* (2013.01); *H01L 23/53238* (2013.01)

(58) Field of Classification Search
CPC ......... H01L 21/76832; H01L 21/30625; H01L 21/76843; H01L 23/53238
See application file for complete search history.

(56) References Cited

U.S. PATENT DOCUMENTS

| | | | |
|---|---|---|---|
| 9,368,362 B2 * | 6/2016 | Rha | H01L 21/76826 |
| 11,183,421 B2 * | 11/2021 | Hsieh | H01L 23/5222 |
| 2012/0319279 A1 * | 12/2012 | Isobayashi | H01L 23/53238 438/653 |

* cited by examiner

*Primary Examiner* — Karen Kusumakar
(74) *Attorney, Agent, or Firm* — WPAT, P.C., Intellectual Property Attorneys; Anthony King

(57) ABSTRACT

An integrated circuit structure and method of manufacturing the same are provided. The integrated circuit structure includes a plurality of conductive features within a dielectric layer overlying a substrate, a barrier layer disposed between each of the plurality of the conductive features and the dielectric layer, a protection layer between sidewalls of the barrier layer and the dielectric layer and a void disposed within the dielectric layer at a position between two adjacent conductive features of the plurality of the conductive features.

20 Claims, 25 Drawing Sheets

INTEGRATED CIRCUIT AND METHOD FOR MANUFACTURING THE SAME

BACKGROUND

Growing demand for smaller and thinner electronic devices with more functions leads to the research and development in the scaling down of transistor dimensions to allow more transistors to be packed within a device in a greater amount to perform more functions. However, such scaling down has also increased the capacitive coupling between adjacent elements. For example, in back-end of line (BEOL) interconnect structures, for any two adjacent conductive features divided by a dielectric material, when the distance between the adjacent conductive features decreases, the resulting capacitance of the dielectric material increases, which results in increased parasitic capacitance, which negatively impacts the speed and overall performance of the device.

Improved methods of reducing capacitance between conductive features with reduced damage to the conductive features are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
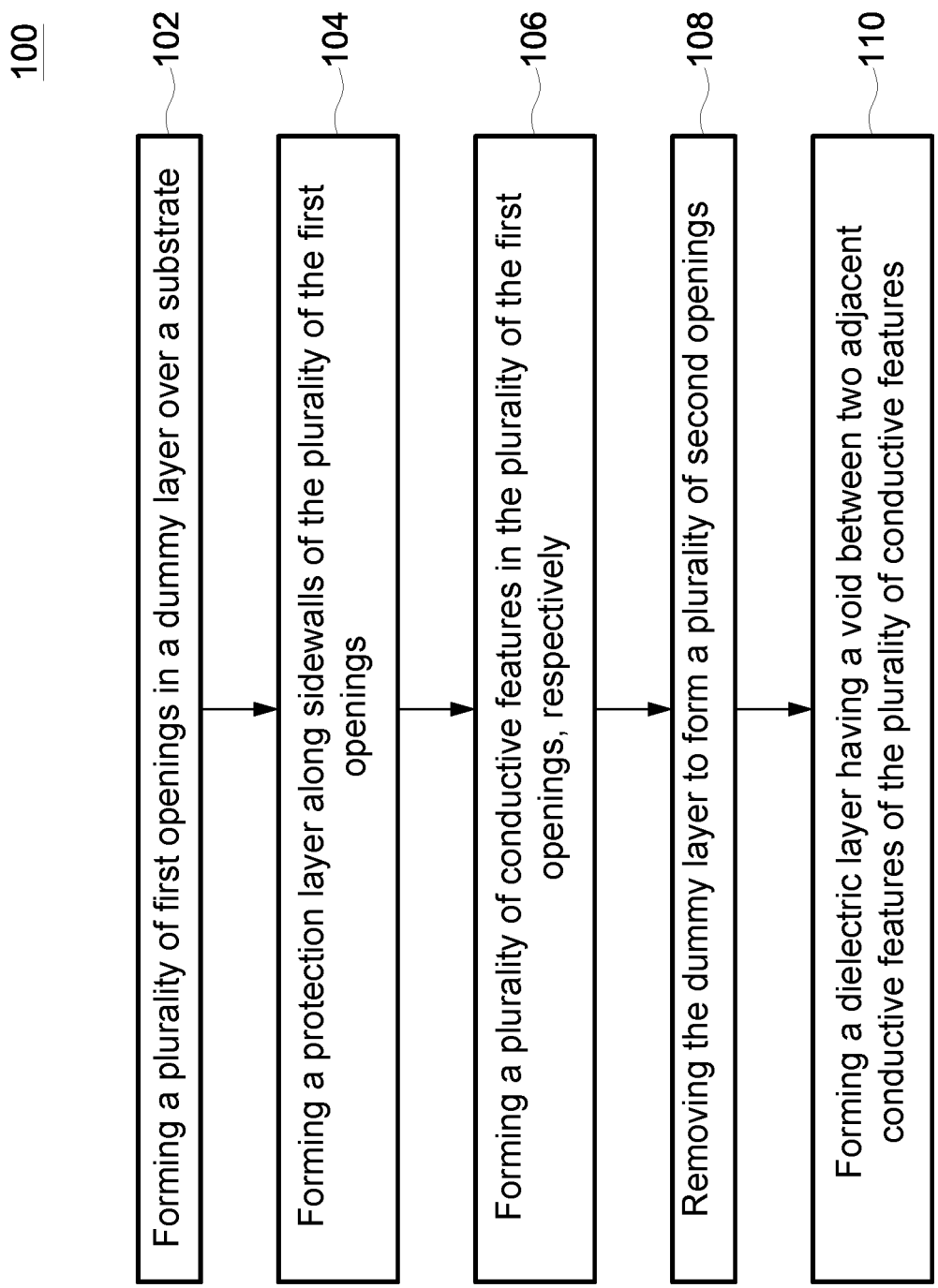
FIG. 1 illustrates a flowchart of a method for fabricating an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Refer to FIG. 1. FIG. 1 illustrates a flowchart for fabricating an integrated circuit structure in accordance with some embodiments of the present disclosure. The method 100 begins with operation 102 in which a plurality of first openings are formed in a dummy layer over a substrate. In some embodiments, the substrate includes a plurality of transistors, gate vias (VGs) and drain vias (VDs) disposed within the substrate. In some embodiments, the VGs and VDs are electrically connected to the transistors. In some embodiments, the first openings expose a portion of the underlying substrate. The method 100 proceeds with operation 104 in which a protection layer is formed along sidewalls of the plurality of the first openings. In some embodiments, the protection layer is initially formed over sidewalls and bottoms of the plurality of the first openings, and is then partially removed so that the bottoms of the first openings are exposed. In some embodiments, the protection layer is formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the protection layer is partially removed by an etching process. In some embodiments, the etching process may include wet etching process and dry etching process. In some embodiments, after the etching process, a portion of the underlying substrate is exposed.

The method 100 proceeds with operation 106 in which a plurality of conductive features are formed in the plurality of the first openings, respectively. In some embodiments, a conductive material is formed on a surface of the integrated circuit structure to fill the first openings. In some embodiments, the conductive material is formed on a surface of the dummy layer as well. In some embodiments, the conductive material is formed on the surface of the integrated circuit structure by a deposition process. In some embodiments, the deposition process may include physical vapor deposition (PVD) process, electrochemical plating process (ECP), chemical vapor deposition (CVD) process, and atomic layer deposition process. In some embodiments, the conductive material formed on the surface of the integrated circuit structure is partially removed by a planarization process to form a plurality of conductive features. In some embodiments, the planarization process may include chemical mechanical polishing. In some embodiments, the conductive material may include a metallic material. In some embodiments, the metallic material may include copper, aluminum, tungsten, or other suitable metals. In some embodiments, the metallic material may include copper or copper alloy, such as copper magnesium, copper aluminum, or copper silicon. The method 100 continues with operation 108 in which the dummy layer is removed to form a plurality of second openings. In some embodiments, the dummy layer is removed by an etching process or a clean process. In some embodiments, the etching process may include a dry etching process and a wet etching process. The wet etching process utilizes a solution containing chemical reactants to be in contact and react with layer(s) of an integrated circuit structure to remove or selectively remove the contacted layer(s).

The dry etching process removes layer(s) of an integrated circuit structure from the surface via ionized plasma or reactive gases, and after the etching process is finished, the surface of the integrated circuit structure, which have been etched, will remain dry. The wet clean process removes material(s) from the surface of an integrated circuit structure via a solution, such as an aqueous solution, with reactants to react with the materials on the surface of the integrated circuit structure and bring the reacted material away with the solution. The dry clean process uses non-ionized gas at high temperature, such as 100° C. or higher, to remove the material(s) from the surface of an integrated circuit structure. In some embodiments, the clean process may include a wet clean process and a dry clean process. In some embodiments, prior to the removal of the dummy layer, a plurality of cap layers are formed over the exposed surfaces of the conductive features. The method continues with operation 110 in which a dielectric layer having a void between two adjacent conductive features of the plurality of conductive features is formed.

In some embodiments, additional processes are performed before, during, and/or after the operations 102 to 110 shown in FIG. 1 to complete the fabrication of the integrated circuit structure, and some of the steps described can be replaced or eliminated for other embodiments of the method.

Figure 2:
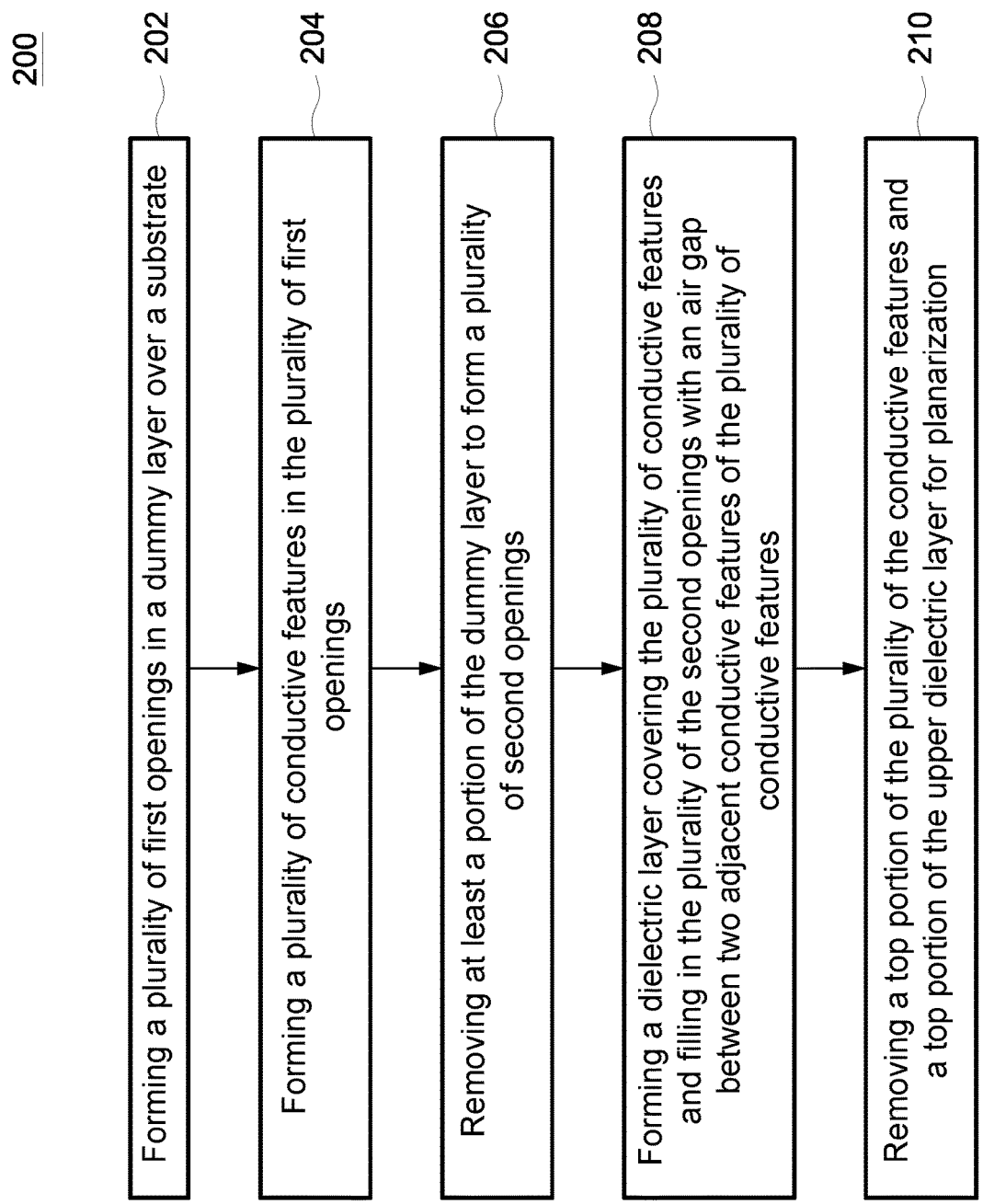
FIG. 2 illustrates a flowchart of a method for fabricating an integrated circuit structure in accordance with some embodiments of the present disclosure.

Refer to FIG. 2. FIG. 2 illustrates a flowchart for fabricating an integrated circuit structure in accordance with some embodiments of the present disclosure. The method 200 begins with operation 202 in which a plurality of first openings are formed in a dummy layer over a substrate. In some embodiments, the substrate includes a plurality of transistors, gate vias (VGs) and drain vias (VDs) disposed within the substrate. In some embodiments, the VGs and VDs are electrically connected to the transistors. In some embodiments, the openings expose a portion of the underlying substrate. The method 200 proceeds with operation 204 in which a plurality of conductive features are formed in the plurality of first openings. In some embodiments, the conductive features are formed in the plurality of the first openings by depositing a conductive material over the dummy layer and the first openings. In some embodiments, the conductive material is partially removed by a planarization process to form a plurality of conductive features. In some embodiments, the planarization process may include chemical mechanical polishing. In some embodiments, the conductive material may include a metallic material. In some embodiments, the metallic material may include copper, aluminum, tungsten, or other suitable metals. In some embodiments, the metallic material may include copper or copper alloy, such as copper magnesium, copper aluminum, or copper silicon.

The method 200 continues with operation 206 in which at least a portion of the dummy layer is removed to form a plurality of second openings. In some embodiments, the dummy layer includes stack of a bottom layer and an upper layer. In some embodiments, the removed portion of the dummy layer may include the upper layer. In some embodiments, the dummy layer is removed by an etching process or a clean process. In some embodiments, the etching process may include a dry etching process and a wet etching process. In some embodiments, the clean process may include a wet clean process and a dry clean process. In some embodiments, prior to the removal of the dummy layer, a plurality of cap layers are formed over the exposed surfaces of the conductive features. The method 200 proceeds with operation 208, in which an upper dielectric layer is formed to cover the plurality of conductive features and filling in the plurality of the second openings with an air gap between two adjacent conductive features of the plurality of conductive features. In some embodiments, the upper dielectric layer is formed on the bottom layer in the second openings. In some embodiments, the upper dielectric layer is formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof. The method continues with operation 210 in which a top portion of the plurality of the conductive features and a top portion of the upper dielectric layer is removed for planarization. In some embodiments, the top portion of the plurality of the conductive features and the top portion of the upper dielectric layer is removed by chemical mechanical polishing.

In some embodiments, a plurality of cap layers are formed on the plurality of the conductive features, respectively. In some embodiments, the cap layers are formed on the plurality of the conductive features subsequent to the removal of the top portion of the plurality of the conductive features and the top portion of the dielectric layer for planarization.

In some embodiments, additional processes are performed before, during, and/or after the operations 202 to 210 shown in FIG. 2 to complete the fabrication of the integrated circuit structure, and some of the steps described can be replaced or eliminated for other embodiments of the method.

FIGS. 3A to 3K illustrate schematic cross-sectional views of an integrated circuit structure 300 at various stages of fabrication in accordance with some embodiments of the present disclosure.

Figure 3A:
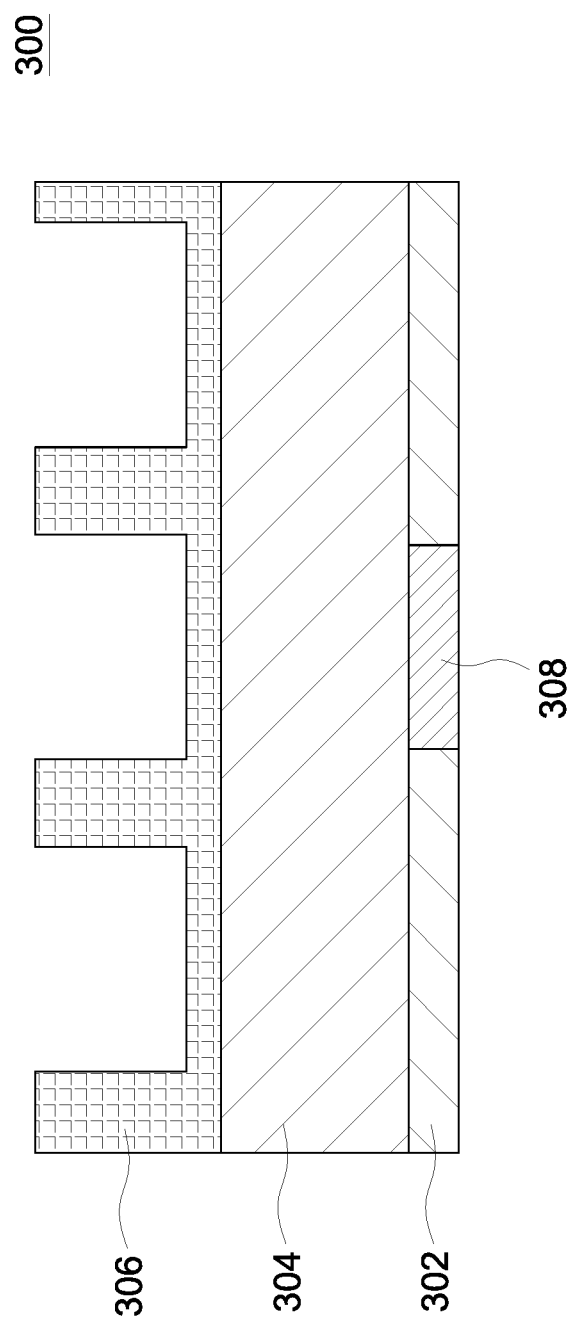
FIGS. 3A to 3K illustrate schematic cross-sectional views of an integrated circuit structure at various stages of fabrication in accordance with some embodiments of the present disclosure.

Refer to FIG. 3A. FIG. 3A illustrates a schematic cross-sectional view of an integrated circuit structure 300 including a substrate 302, a dummy layer 304 over the substrate 302, and a hardmask layer 306 over the dummy layer 304 in accordance with some embodiments of the present disclosure. In some embodiments, a plurality of conductive vias 308 are formed within the substrate 302. In some embodiments the conductive vias 308 may electrically connect the underlying conductive elements, such as drains of transistors, gates of transistors, conductive lines or combinations thereof. In some embodiments, the dummy layer 304 may be formed of a silicon-containing material, such as silicon dioxide ($SiO_2$), silicon oxycarbide (SiOC), silicon oxycarbonitride (SiOCN), or a combination thereof. In some embodiments, the dummy layer may have a thickness of from 100 to 250 Å. In some embodiments, the dummy layer 304 may be formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the dummy layer 304 may be formed directly on a top surface of the substrate 302. In other embodiments, the dummy layer 304 may be formed on intermediate layers, and/or structures (not shown) which are on the substrate 302. In some embodiments, the intermediate layers may include etch stop layers.

In some embodiments, the hardmask layer 306 includes multiple layers. In some embodiments, the multiple layers may be formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the hard mask layer 306 is formed on a top surface of the dummy layer 304. In some embodiment, a photolithographic masking process may be performed to the multiple layers to define a pattern of the hard mask layer 306. In some embodiments, a "hard mask layer open" process may be performed to the patterned multiple layers to form a plurality of hard mask openings in the resulting hard mask layer 306 In some embodiments, the "hard mask layer open" process may include an etching processes to form the hard mask openings in the hard mask layer 306 by etching through the pattern defined by the photolithographic masking process. In some embodiments, the etching process may include a wet etching process and a dry etching process, or a combination thereof.

In some embodiments, the hard mask openings may be further trimmed to enlarge the dimensions of the hard mask openings. The patterned hard mask layer 306 serves as a mask for further "dummy layer open" process for forming openings in the dummy layer 304. In some embodiments, a portion of the hard mask layer 306 remains at the bottom of the hard mask openings. In some embodiments, the patterned hard mask layer 306 exposes a portion of the underlying dummy layer 304.

Figure 3B:
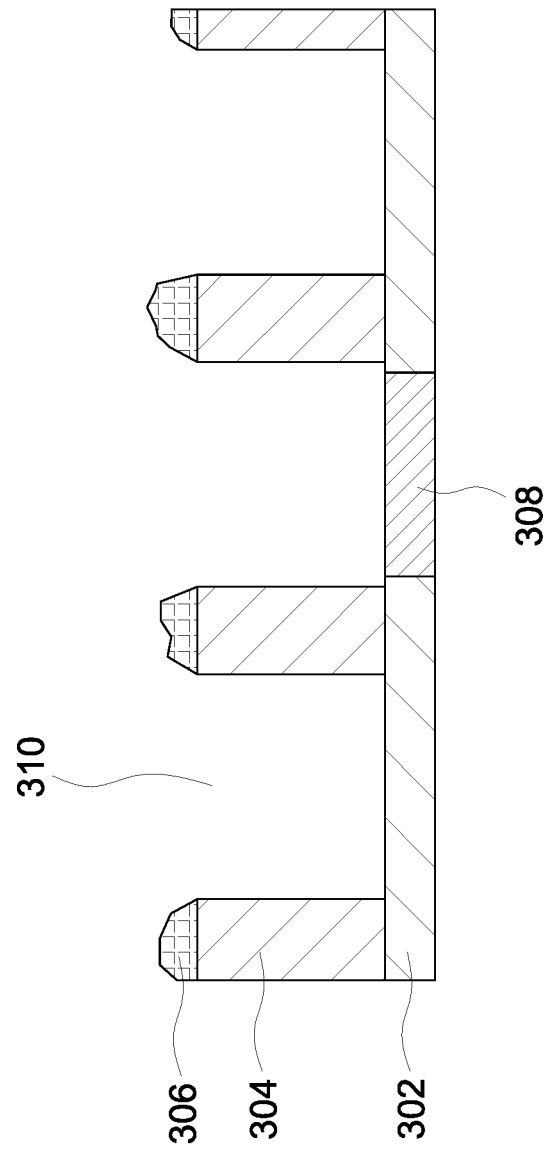

Refer to FIG. 3B. As shown in FIG. 3B, a "dummy layer open" process is performed to the integrated circuit structure 300 as shown in FIG. 3A to remove a portion of the hard mask layer 306 and a portion of the dummy layer 304 to form a plurality of first openings 310 in the dummy layer 304. In some embodiments, the portion of the hard mask layer 306 and the portion of the dummy layer 304 may be removed by an etching process. In some embodiments, the "hard mask layer open" process may be carried out together with the "dummy layer open" process to save time and cost as the two processes can be performed in one process tool without transferring the processing integrated structure to different process tools for carrying out different processes. In some embodiments, the etching process may include a wet etching process, a dry etching process, or combination thereof. In some embodiments, the first openings 310 expose a portion of the substrate 302. In some embodiments, the first openings 310 expose a portion of the intermediate layer(s), such as underlying etch stop layer(s) over the substrate 302. In some embodiments, the underlying etch stop layer(s) may be further removed to expose a portion of the substrate 302. In some embodiments, the underlying etch stop layer(s) may be removed by an etching process. In some embodiments, the etching process may include a wet etching process, a dry etching process, or combination thereof.

Figure 3C:
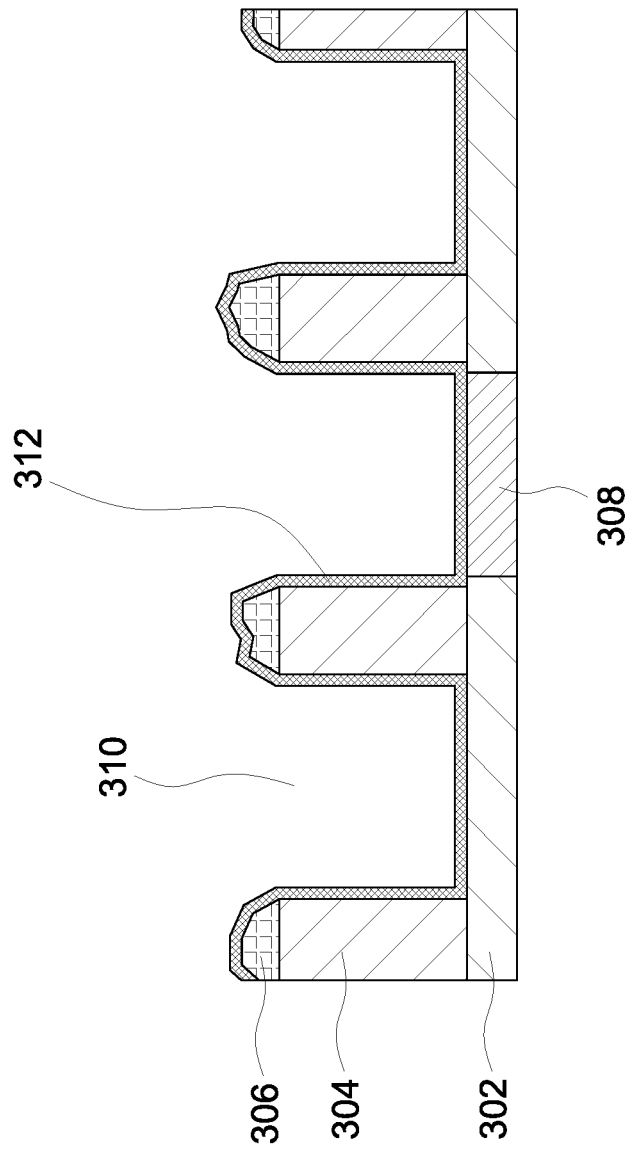

Refer to FIG. 3C. As shown in FIG. 3, a protection layer 312 is formed on along sidewalls and bottoms of the plurality of the first openings 310. In some embodiments, the protection layer 312 may be formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof.

Figure 3D:
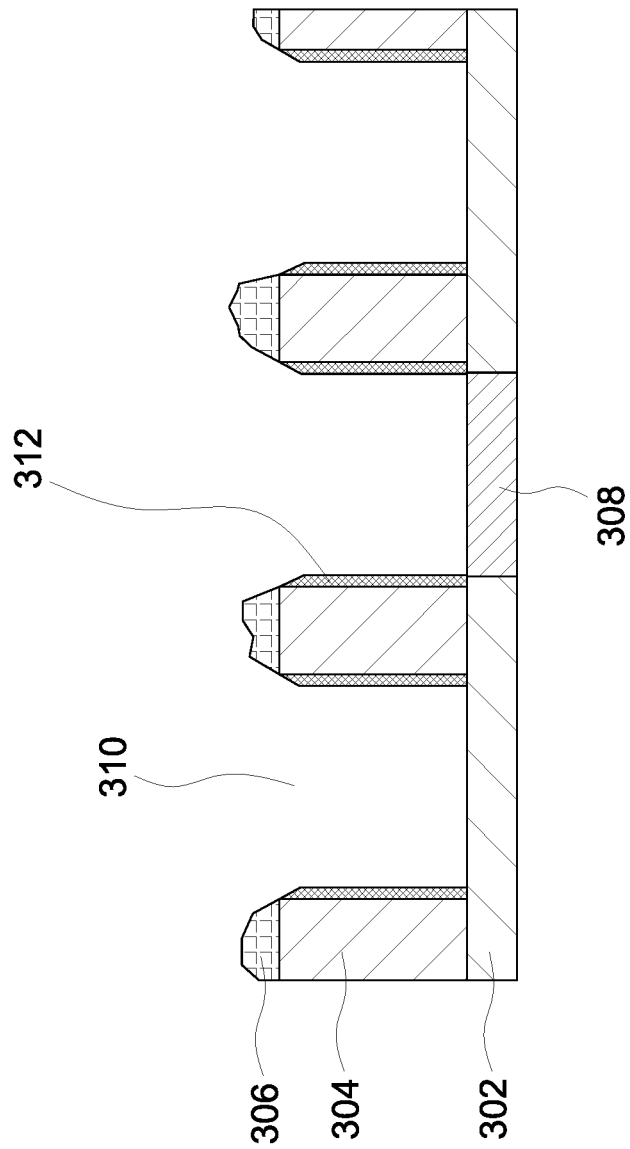

Refer to FIG. 3D. As shown in FIG. 3D, in some embodiments, an "etch back" process is carried out to remove a portion of the protection layer 312 from the integrated circuit structure 300 so that a portion of the substrate 302 is exposed within the first openings 310 is exposed. In some embodiments, the "etch back" process may be an etch process. In some embodiments, the etching process may include a wet etching process, a dry etching process, or combination thereof. In some embodiments, the remaining protection layer 312 covers the sidewalls of the first openings 310. The protection layer 312 remaining on the sidewalls of the first openings 310 provides structural support to the conductive materials, such as a barrier layer, a seed layer, conductive features or combinations thereof, as will be discussed below, formed within the first openings 310. The structural support by the protection layer 312 alleviates the possibility of the aforementioned conductive materials, which may have a weak structural integrity due to their small size, collapsing during subsequent operations. For example, in a subsequent "dummy layer removal process" operation (see FIG. 3H), when the dummy layer 304 is removed, the protection layer 312 prevents the conductive materials formed within the first openings 310 from distorting in the absence of the dummy layer 304. In some embodiments, the protection layer 312 may prevent the barrier layer from being damaged when carrying out the dummy layer removal process. Suitable materials for forming the protection layer 312 may include silicon nitride, silicon oxycarbide (SiOC), silicon, titanium monoxide (TiO), silicon carbonitride (SiCN), or combinations thereof. In some embodiments, the remaining protection layer 312 may have a thickness of up to 25 Å.

Figure 3E:
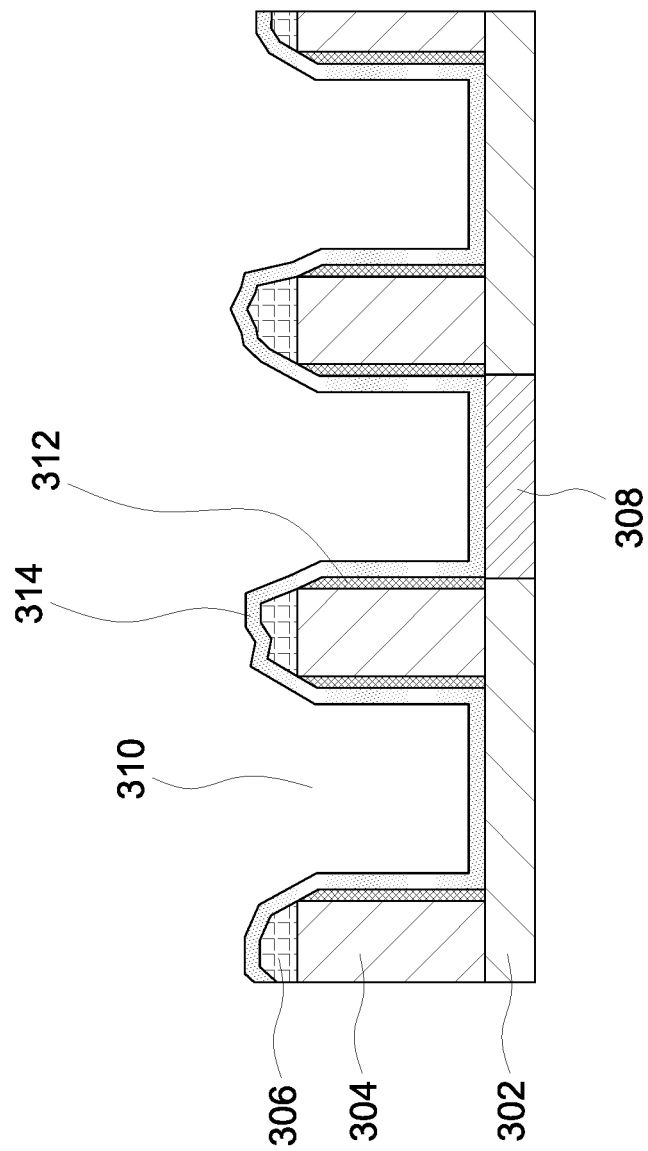

Refer to FIG. 3E. In some embodiments, a barrier layer 314 is formed over the plurality of the first openings 310. In some embodiments, the barrier layer 314 may be formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof. The barrier layer 314 functions, as its name indicates, a barrier to alleviate the possibility of conductive ions of the conductive features 316b, such as metal ions, from diffusing into the dielectric layer (see FIG. 3I, the dielectric layer 322) formed during subsequent operations when the conductive materials are formed within the first openings 310. The barrier layer 314 may include cobalt, ruthenium, tantalum nitride, titanium nitride, or combinations thereof. In some embodiments, the barrier layer 314 may be electrically connected to the underlying conductive vias 308.

Figure 3F:
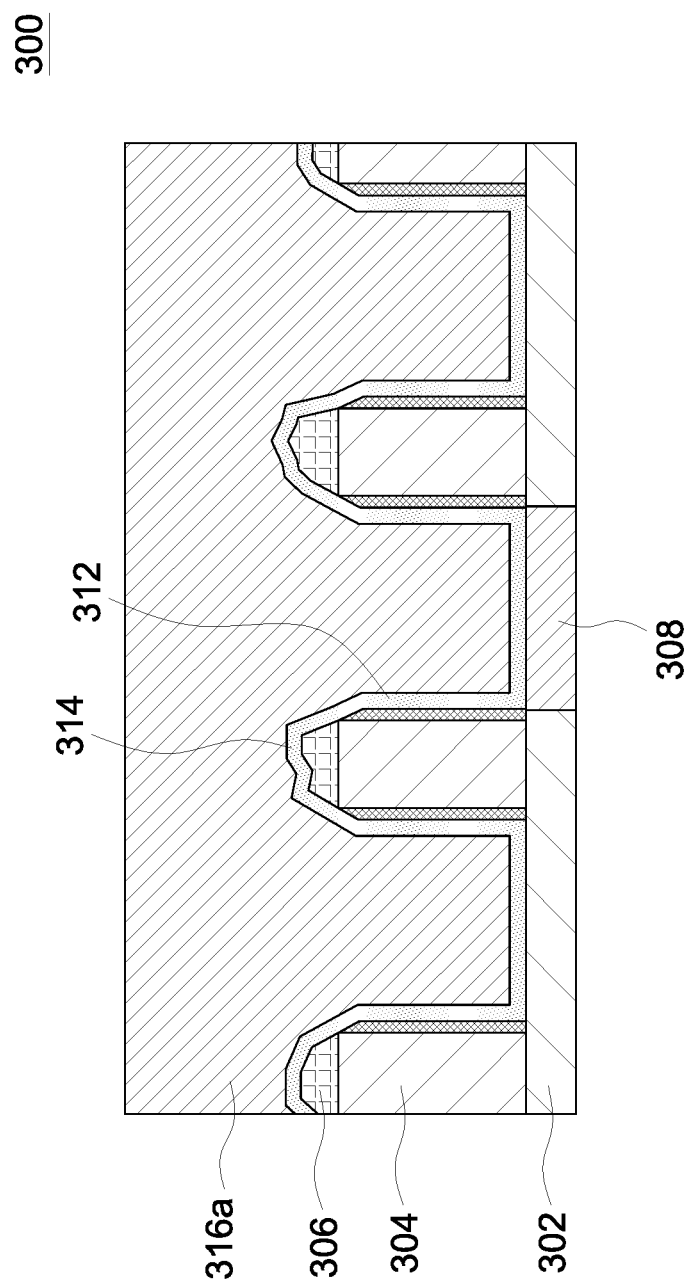

Refer to FIG. 3F. A conductive layer 316a is formed on a surface of the integrated circuit structure to fill the first openings 310. In some embodiments, the conductive layer 316a may include a metallic material. In some embodiments, the metallic material may include copper, aluminum, tungsten, or other suitable metals. In some embodiments, the metallic material may include copper or copper alloy, such as copper magnesium, copper aluminum, or copper silicon. In some embodiments, the conductive layer 316a is formed by a deposition process. In some embodiments, the deposition process may include physical vapor deposition (PVD) process, electrochemical plating process (ECP), chemical vapor deposition (CVD) process, and atomic layer deposition process.

Figure 3G:
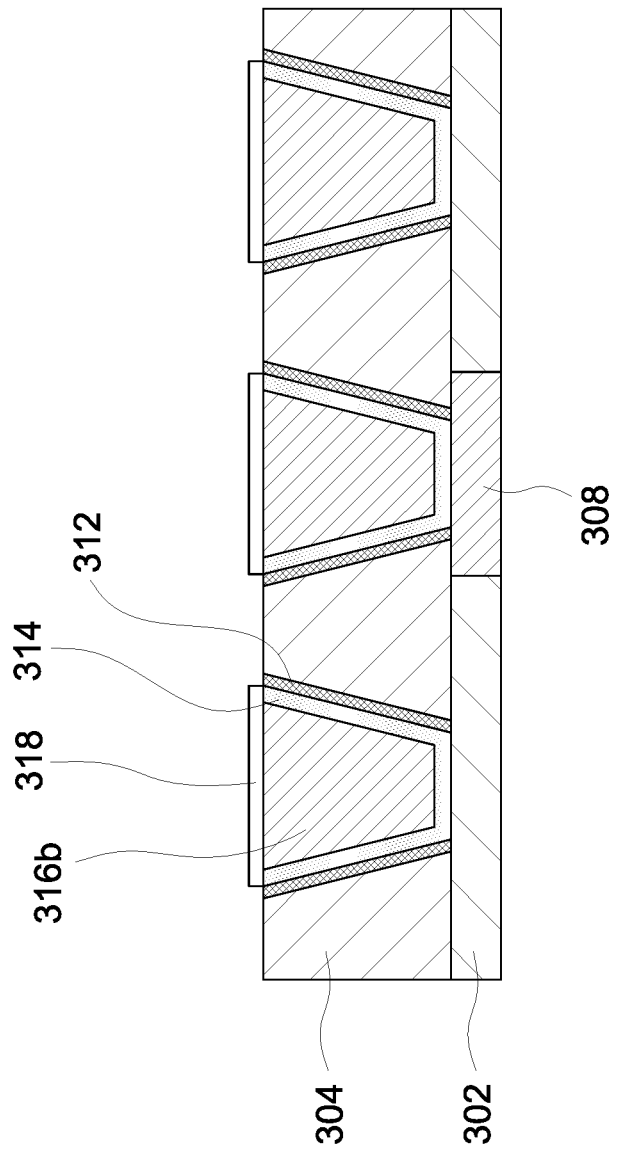

Refer to FIG. 3G. FIG. 3G illustrates a planarization of the conductive layer 316a. In some embodiments, the planarization may be carried out by a chemical mechanical polishing (CMP) process to form conductive features 316b having top surfaces substantially co-planar with a top surface of the dummy layer 304. In some embodiments, the conductive features 316b are electrically connected to the underlying conductive vias 308.

Still refer to FIG. 3G. As shown in FIG. 3G, in some embodiments, a plurality of first cap layers 318 are formed over the conductive features 316b. In some embodiments, the first cap layers 318 are selectively formed on the conductive features 316b and the barrier layer 314. In some embodiments, the first cap layer 318 is formed entirely over the integrated circuit structure 300 and then subjected to a patterning process to remove portions of the first cap layer 318 on the dielectric layer 304, while leaving another portion of the first cap layer 318 on the conductive features 316b and the barrier layer 314. In some embodiments, the first cap layers 318 are selectively formed on the conductive features 316b and the barrier layer 314 to alleviate the possibility of damaging the conductive features 316b and the barrier layer 314 during subsequent "dummy layer removal" process. The first cap layers 318 may be formed by a deposition process such as low-pressure chemical vapor deposition (LPCVD) process, chemical vapor deposition (CVD) process, plasma enhanced chemical vapor deposition (PECVD) process, plasma-enhanced atomic layer deposition (PEALD) process, physical vapor deposition (PVD) process, sputtering, or combinations thereof. In some embodiments, the first cap layers 318 may be metal-containing layers. In some embodiments, the first cap layers 318 may include cobalt, copper, tungsten, aluminum, manganese, ruthenium, combinations thereof, and alloys thereof.

Figure 3H:
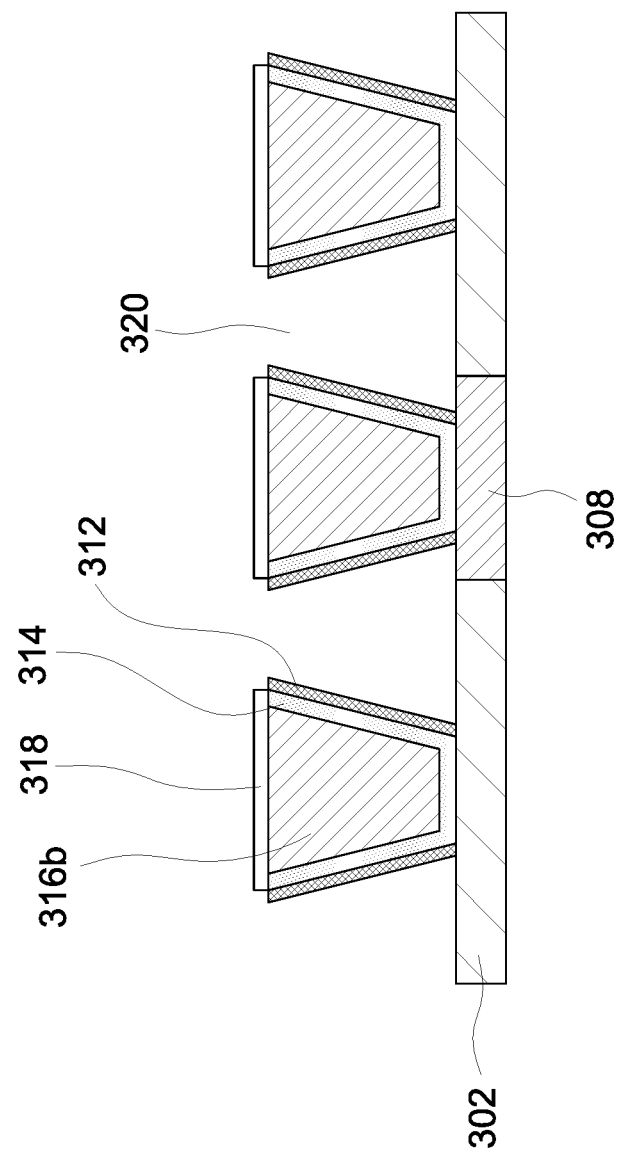

Refer to FIG. 3H. As shown in FIG. 3H, a "dummy layer removal" process is performed to remove the dummy layer 304 from the integrated circuit structure 300 to form a plurality of second openings 320. In some embodiments, the dummy layer removal process may be an etch process or a clean process. In some embodiments, the etch process may be an etching process or a clean process. In some embodiments, the clean process may include a wet clean process and a dry clean process.

Figure 3I:
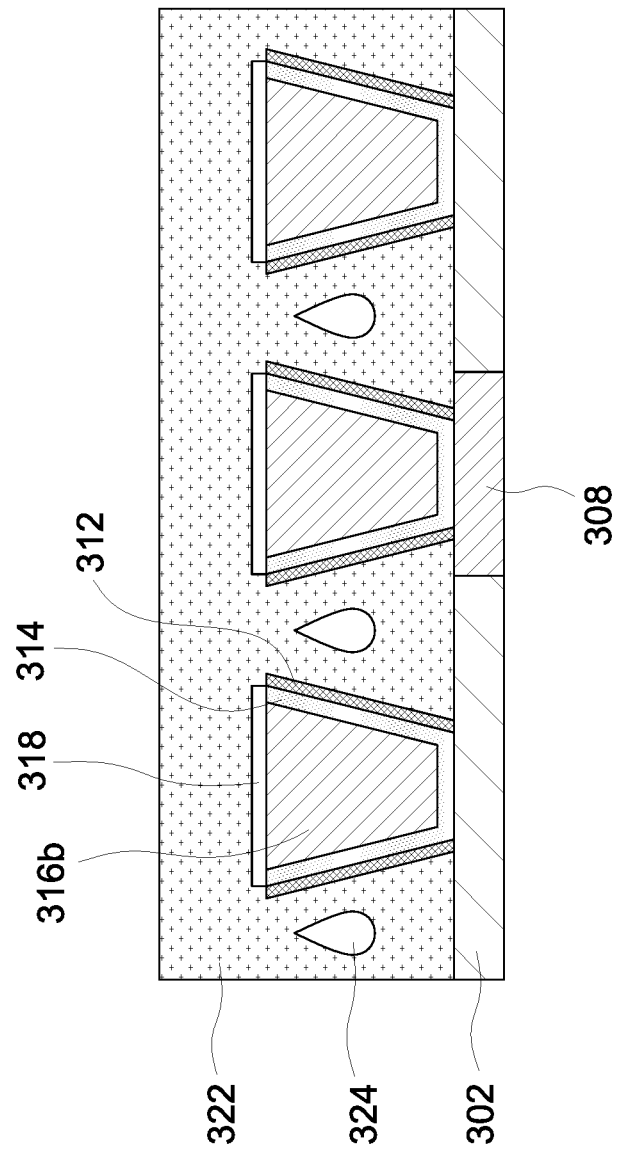

Refer to FIG. 3I. As shown in FIG. 3I, a dielectric layer 322 is formed on the substrate 302. The dielectric layer 322 formed within the second openings 320 seals an air gap/void between two adjacent conductive features 316b. The dielectric layer 322 may be formed of oxides such as silicon oxide, BPSG, USG, FSG, low-k dielectrics such as carbon doped oxides, extremely low-k dielectrics such as porous carbon doped silicon dioxide, a polymer such as polyimide, or a combination thereof. In some embodiments, the low-k dielectric materials may have k values lower than 3.9. In some embodiments, the dielectric layer 322 may be formed by a deposition process such as CVD, PVD, PECVD, ALD, an SOD, or a combination thereof.

Figure 3J:
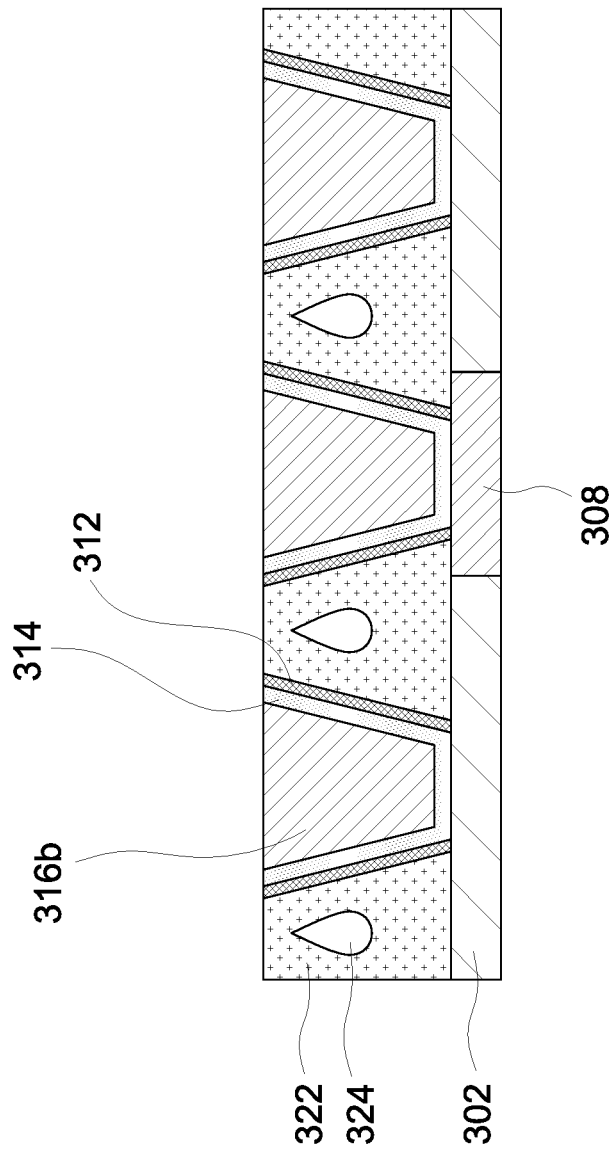

Refer to FIG. 3J. FIG. 3J illustrates a planarization of the dielectric layer 322 and the conductive features 316b. In some embodiments, the planarization may be carried out by a chemical mechanical polishing (CMP) process to remove the first cap layers 318, a top portion of the conductive features 316b, and a top portion of the dielectric layer 322. In some embodiments, an upper surface of the dielectric layer 322 is substantially flushed with upper surfaces of the conductive features 316b. In some embodiments, after the planarization, the voids/air gaps 324 remain sealed in the dielectric layer 322.

Figure 3K:
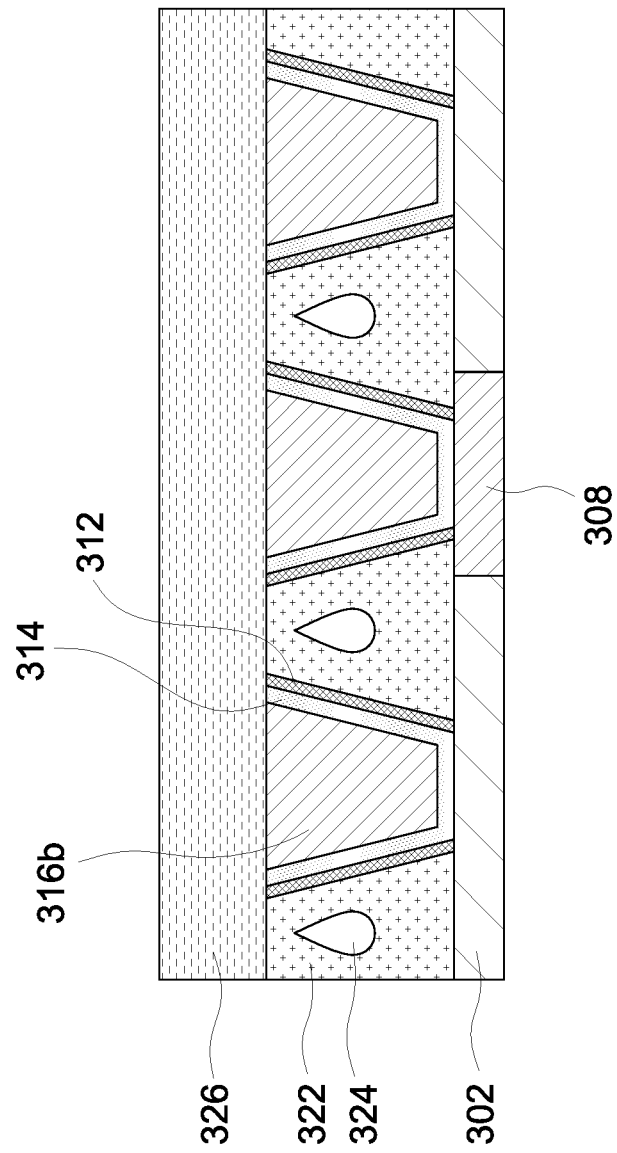

Refer to FIG. 3K. An etch stop layer 326 is formed over the dielectric layer 322, the conductive features 316b and the voids 324. In some embodiments, the etch stop layer 326 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. As shown in FIG. 3K, in some embodiments, the integrated circuit structure 300 includes a plurality of conductive features 316b within a dielectric layer 322 overlying a substrate 302, a barrier layer 314 disposed between each of the plurality of the conductive features 316b and the dielectric layer 322, a protection layer 312 between sidewalls of the barrier layer 314 and the dielectric layer 322, and a void/air gap 322 disposed within the dielectric layer 322 at a position between two adjacent conductive features 316b of the plurality of the conductive features 316b. In some embodiments, the integrated circuit structure 300 may further include a plurality of electrical terminals disposed under and electrically connected to one of the plurality of conductive features 316b, wherein the protection layer 312 exposes bottom surfaces of the plurality of conductive features 316b and upper surfaces of the electrical terminals.

The integrated circuit structure and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 4A:
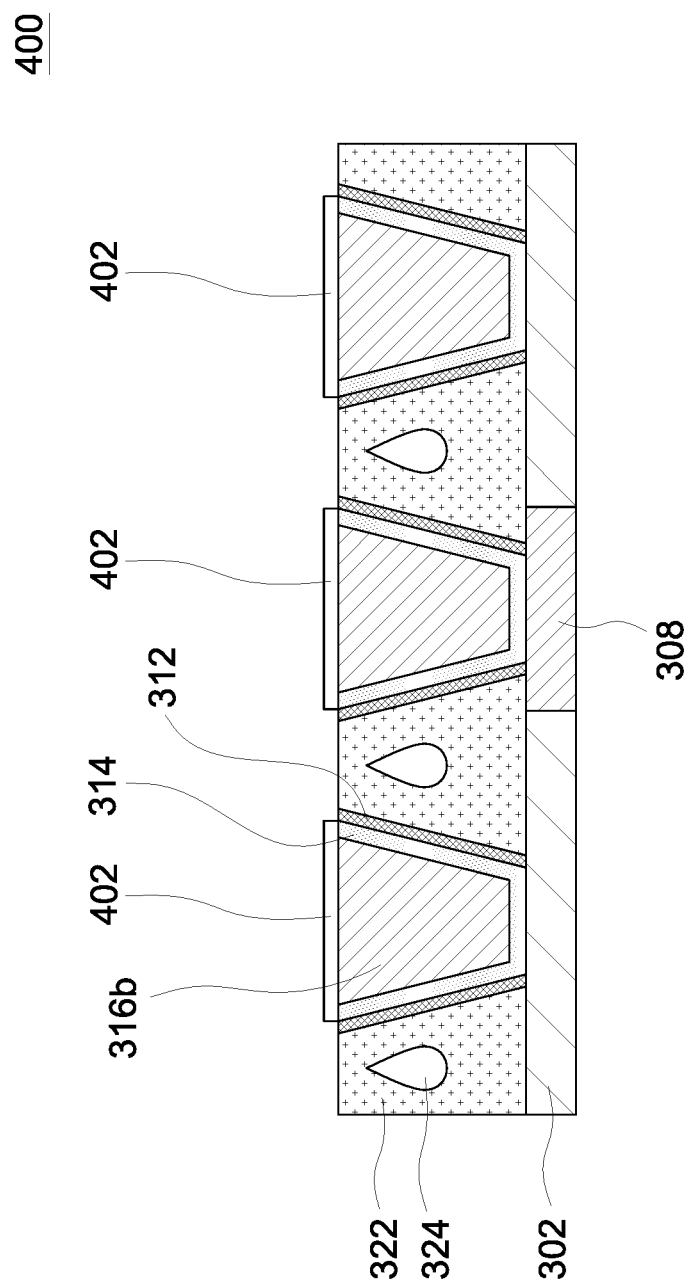
FIGS. 4A to 4B illustrate schematic cross-sectional views of an integrated circuit structure at various stages of fabrication in accordance with some embodiments of the present disclosure.
Figure 4B:
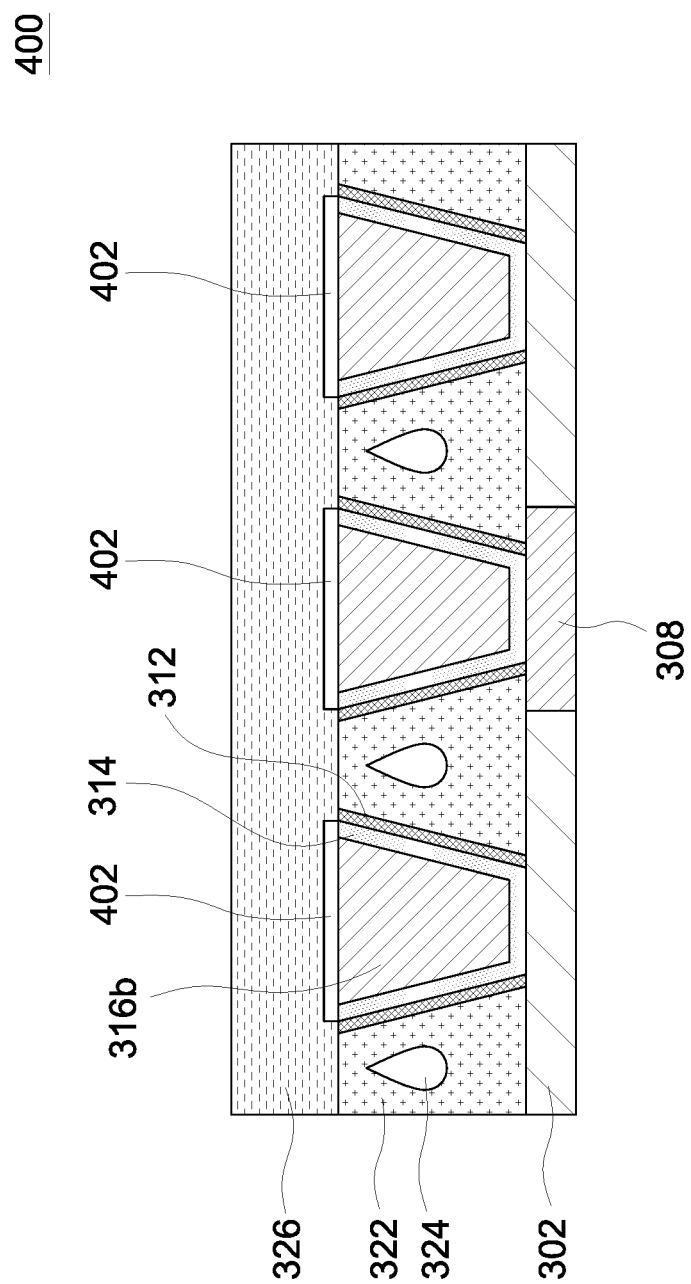

FIGS. 4A to 4B illustrate schematic cross-sectional views of an integrated circuit structure at various stages of fabrication in accordance with some embodiments of the present disclosure.

Refer to FIG. 4A. In some alternative embodiments, after the planarization of the dielectric layer 322 and the conductive features 316b as shown in FIG. 3J, a plurality of second cap layers 402 are formed over the conductive features 316b so as to reduce the oxidation of the conductive features 316b as top surfaces of the conductive features 316b are exposed after the planarization. In some embodiments, the second cap layers 402 are selectively formed on the conductive features 316b and at least a portion of the barrier layer 314. In some embodiments, the etch stop layer 402 is further disposed over the protection layer 312. In some embodiments, the second cap layer 402 is formed entirely over the integrated circuit structure 400 and then subjected to a patterning process to remove portions of the second cap layer 402 on the dielectric layer 322, while leaving another portion of the second cap layer 402 on the conductive features 316b and the barrier layer 314. The second cap layers 402 may be formed by a deposition process such as low-pressure chemical vapor deposition (LPCVD) process, chemical vapor deposition (CVD) process, plasma enhanced chemical vapor deposition (PECVD) process, plasma-enhanced atomic layer deposition (PEALD) process, physical vapor deposition (PVD) process, sputtering, or combinations thereof. In some embodiments, the second cap layers 402 may be metal-containing layers. In some embodiments, the second cap layers 402 may include cobalt, copper, tungsten, aluminum, manganese, ruthenium, combinations thereof, and alloys thereof.

Refer to FIG. 4B. After the second cap layers 402 are formed, an etch stop layer 326 is formed over the dielectric layer 322, the second cap layers 402, the conductive features 316b and the voids/air gaps 324. In some embodiments, the etch stop layer 326 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. In some embodiments, comparing to the integrated circuit structure 300 shown in FIG. 3K, the integrated circuit structure 400 further includes a plurality of cap layers 326 disposed on the plurality of the conductive features 316b, respectively. In some embodiments, the second cap layers 402 may be further disposed on at least a portion of the barrier layer 314. In some embodiments, the integrated circuit structure 400 may further include a plurality of electrical terminals disposed under and electrically connected to one of the plurality of conductive features 316b, wherein the protection layer 312 exposes bottom surfaces of the plurality of conductive features 316b and upper surfaces of the electrical terminals.

FIGS. 5A to 5F illustrate schematic cross-sectional views of an integrated circuit structure at various stages of fabrication in accordance with some embodiments of the present disclosure.

Figure 5A:
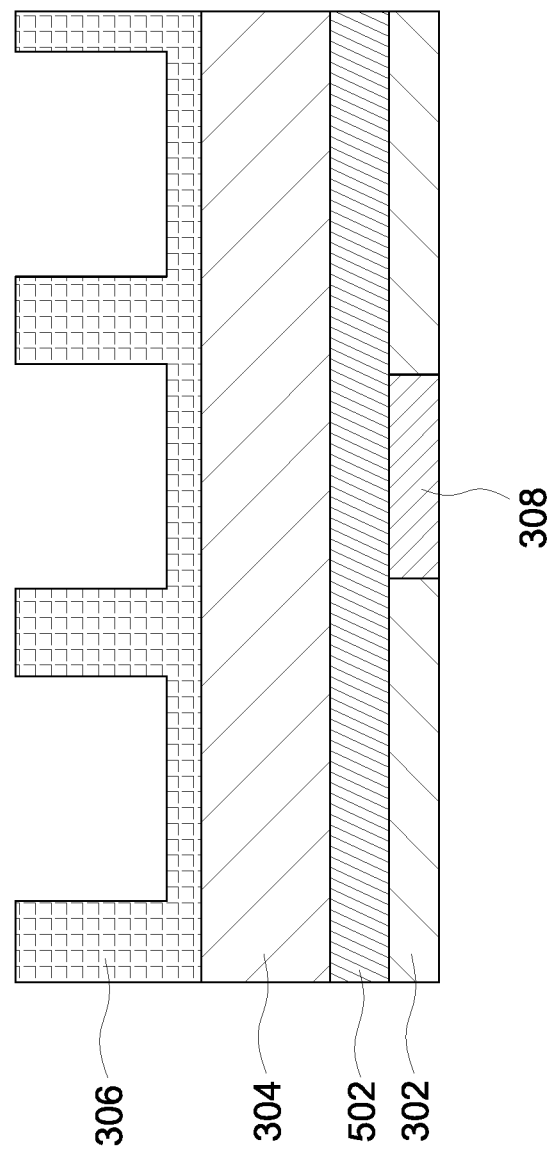
FIGS. 5A to 5F illustrate schematic cross-sectional views of an integrated circuit structure at various stages of fabrication in accordance with some embodiments of the present disclosure.

Refer to FIG. 5A. FIG. 5A illustrates a schematic cross-sectional view of an integrated circuit structure 500 including a substrate 302, a lower dielectric layer 502 over the substrate 302, a dummy layer 304 over lower dielectric layer 502, and a hardmask layer 306 over the dummy layer 304 in accordance with some embodiments of the present disclosure. In some embodiments, a plurality of conductive vias 308 are formed within the substrate 302. In some embodiments the conductive vias 308 may electrically connect the underlying conductive elements, such as drains of transistors, gates of transistors, conductive lines or combinations thereof. In some embodiments, the lower dielectric layer 502 may be formed of a may be formed of oxides such as silicon oxide, BPSG, USG, FSG, low-k dielectrics such as carbon doped oxides, extremely low-k dielectrics such as porous carbon doped silicon dioxide, a polymer such as polyimide, or a combination thereof. In some embodiments, the low-k dielectric materials may have k values lower than 3.9. In some embodiments, the lower dielectric layer 502 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the dummy layer 304 may be formed of a silicon-containing material, such as $SiO_2$, SiOC, SiOCN, or a combination thereof. In some embodiments, the dummy layer has a thickness of from 100 to 250 Å. In some embodiments, the dummy layer 304 may be formed by a deposition process. In some embodiments, the deposition process may include chemical vapor deposition (CVD), physical vapor deposition (PVD), plasma-enhanced CVD (PECVD), atomic layer deposition (ALD), a spin-on-dielectric (SOD) process, or a combination thereof. In other embodiments, the lower dielectric layer 502 is formed on intermediate layers, and/or structures (not shown) which are on the substrate 302. In some embodiments, the intermediate layers may include etch stop layers.

Figure 5B:
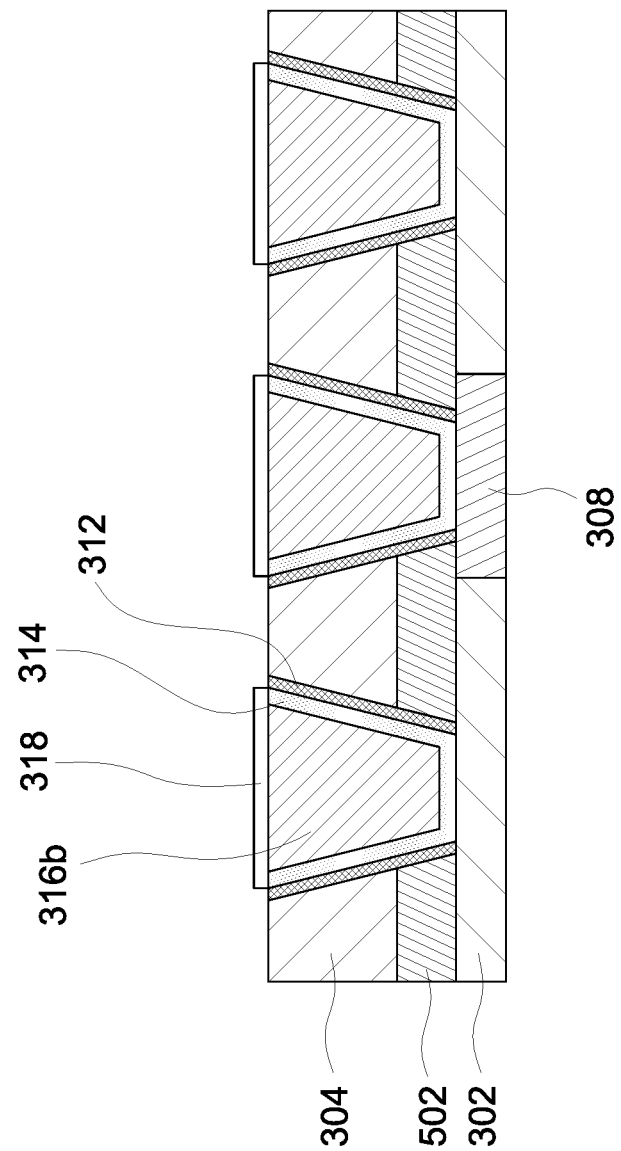

Refer to FIG. 5B. The operations similar to those carried out between FIG. 3A and FIG. 3G are omitted in description. FIG. 5B illustrates a schematic cross-sectional view of the integrated circuit structure 500 a planarization of the conductive layer 316a. In some embodiments, the planarization may be carried out by a chemical mechanical polishing (CMP) process to form conductive features 316b having top surfaces substantially co-planar with a top surface of the dummy layer 304. In some embodiments, the conductive features 316b are electrically connected to the underlying conductive vias 308. In some embodiments, a plurality of first cap layers 318 are formed over the conductive features 316b. In some embodiments, the first cap layers 318 are selectively formed on the conductive features 316b and the barrier layer 314. In some embodiments, the first cap layer 318 is formed entirely over the integrated circuit structure 500 and then subjected to a patterning process to remove portions of the first cap layer 318 on the dielectric layer 304, while leaving another portion of the first cap layer 318 on the conductive features 316b and the barrier layer 314. In some embodiments, the first cap layers 318 are selectively formed on the conductive features 316b and the barrier layer 314 to alleviate the possibility of damaging the conductive features 316b and the barrier layer 314 during subsequent "dummy layer removal" process. The first cap layers 318 may be formed by a deposition process such as low-pressure chemical vapor deposition (LPCVD) process, chemical vapor deposition (CVD) process, plasma enhanced chemical vapor deposition (PECVD) process, plasma-enhanced atomic layer deposition (PEALD) process, physical vapor deposition (PVD) process, sputtering, or combinations thereof. In some embodiments, the first cap layers 318 may be metal-containing layers. In some embodiments, the first cap layers 318 may include cobalt, copper, tungsten, aluminum, manganese, ruthenium, combinations thereof, and alloys thereof.

Figure 5C:
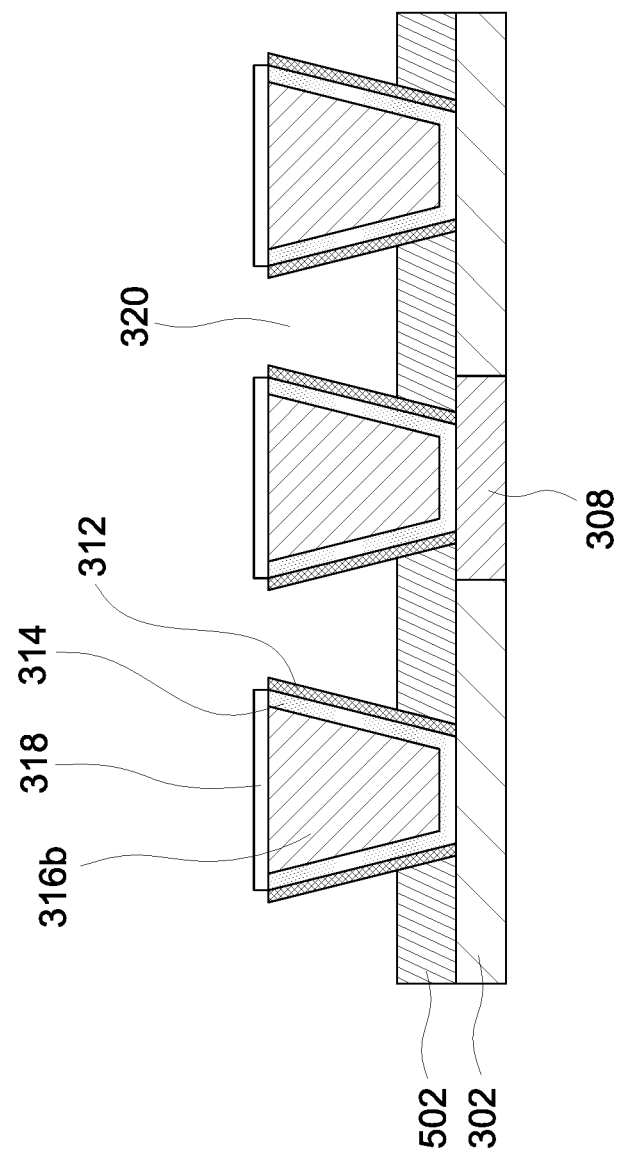

Refer to FIG. 5C. A "dummy layer removal" process is performed to remove the dummy layer 304 from the integrated circuit structure 500 to form a plurality of second openings 320. In some embodiments, the dummy layer removal process may be an etch process or a clean process. In some embodiments, the etch process may be an etching process or a clean process. In some embodiments, the clean process may include a wet clean process and a dry clean process. In some embodiments, after the "dummy layer removal" process, the lower dielectric layer 502 remains in the integrated circuit structure to support the structure of the conductive features 316b from distortion after the dummy layer 304 is removed.

Figure 5D:
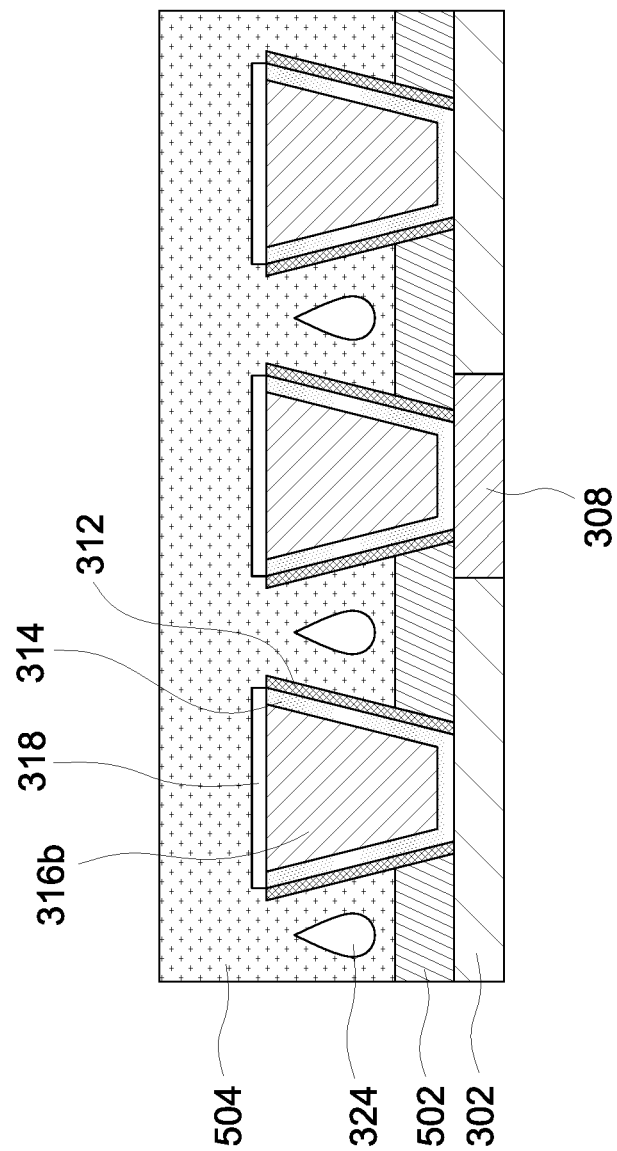

Refer to FIG. 5D. An upper dielectric layer 504 is formed on the lower dielectric layer 502. The upper dielectric layer 504 formed within the second openings 320 seals a void/air gap between two adjacent conductive features 316b. The upper dielectric layer 504 may be formed of oxides such as silicon oxide, BPSG, USG, FSG, low-k dielectrics such as carbon doped oxides, extremely low-k dielectrics such as porous carbon doped silicon dioxide, a polymer such as polyimide, or a combination thereof. In some embodiments, the low-k dielectric materials may have k values lower than 3.9. In some embodiments, the upper dielectric layer 504 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the lower dielectric layer and the upper dielectric layer includes different dielectric materials. In some embodiments, the lower dielectric layer and the upper dielectric layer includes the same dielectric material(s).

Figure 5E:
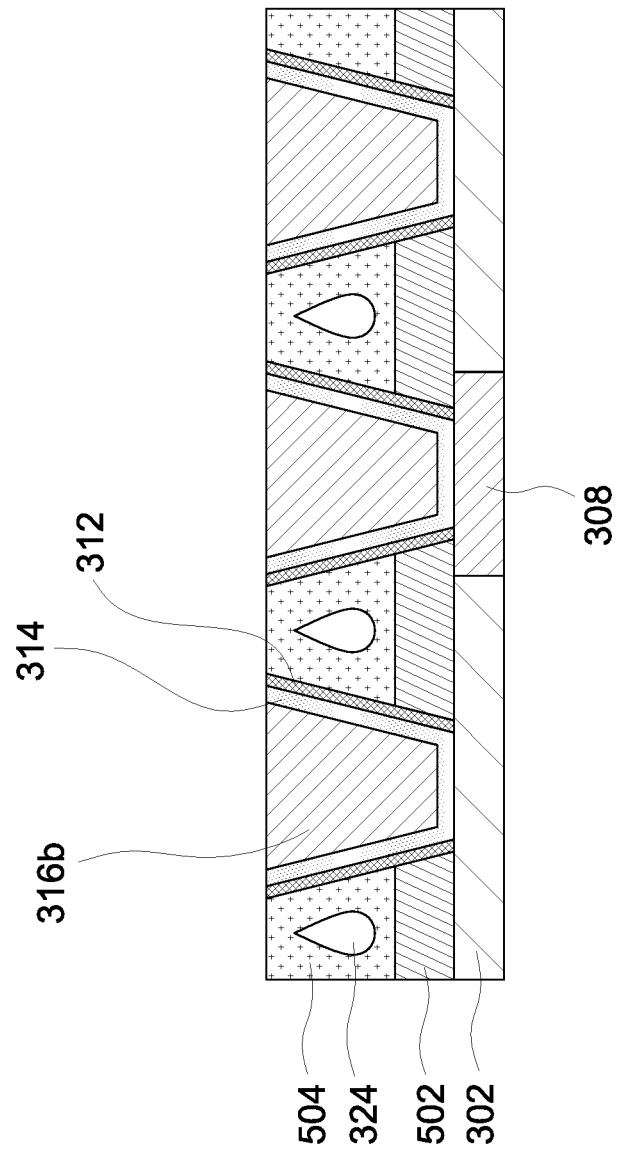

Refer to FIG. 5E. FIG. 5E illustrates a planarization of the upper dielectric layer 504 and the conductive features 316b. In some embodiments, the planarization may be carried out by a chemical mechanical polishing (CMP) process to remove the first cap layers 318, a top portion of the conductive features 316b, and a top portion of the upper dielectric layer 504. In some embodiments, the conductive features 316b have top surfaces substantially co-planar with a top surface of the upper dielectric layer 504. In some embodiments, after the planarization, the voids 324 remain sealed in the upper dielectric layer 504.

Figure 5F:
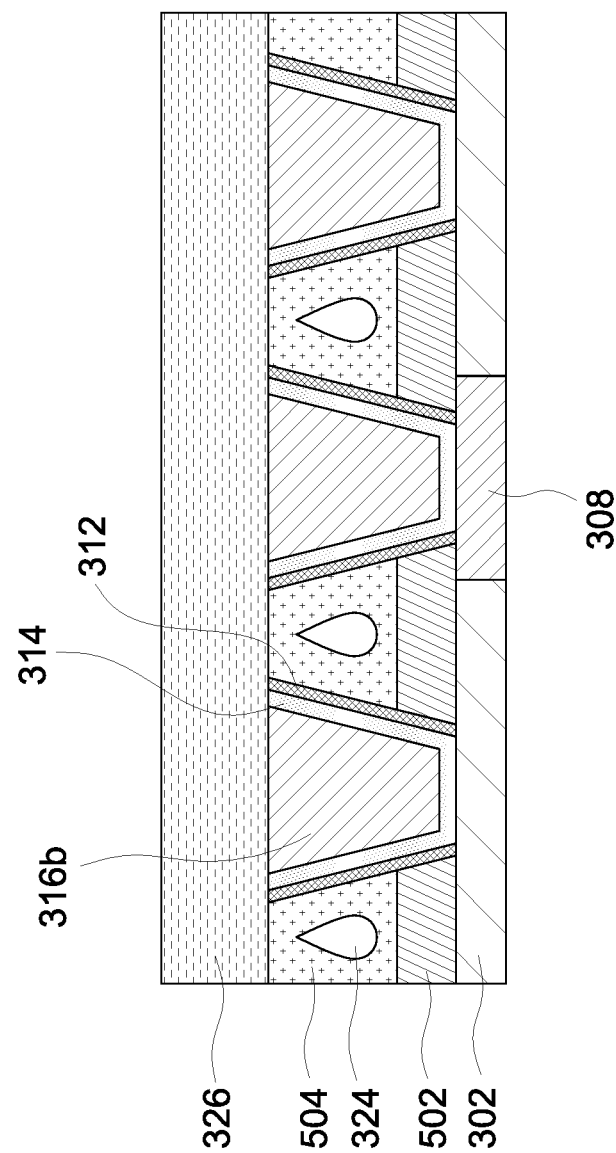

Refer to FIG. 5F. An etch stop layer 326 is formed over the upper dielectric layer 504, the conductive features 316b and the voids 324. In some embodiments, the etch stop layer 326 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the integrated circuit structure 500 may further include a plurality of electrical terminals disposed under and electrically connected to one of the plurality of conductive features 316b, wherein the protection layer 312 exposes bottom surfaces of the plurality of conductive features 316b and upper surfaces of the electrical terminals.

Figure 6A:
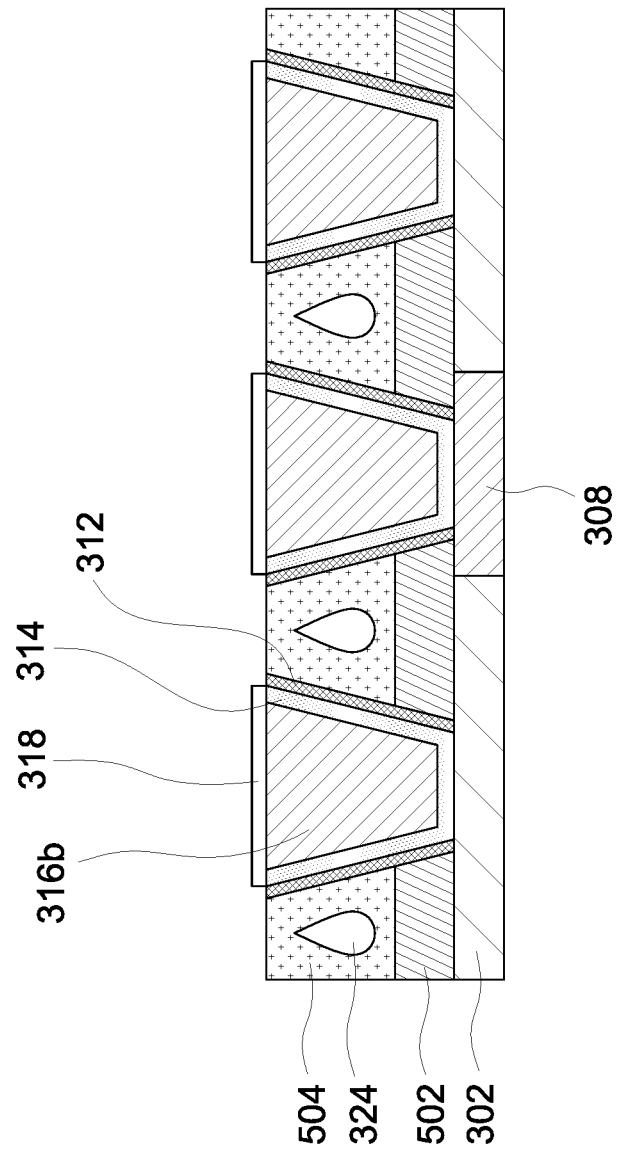
FIGS. 6A to 6B illustrate schematic cross-sectional views of an integrated circuit structure at various stages of fabrication in accordance with some embodiments of the present disclosure.
Figure 6B:
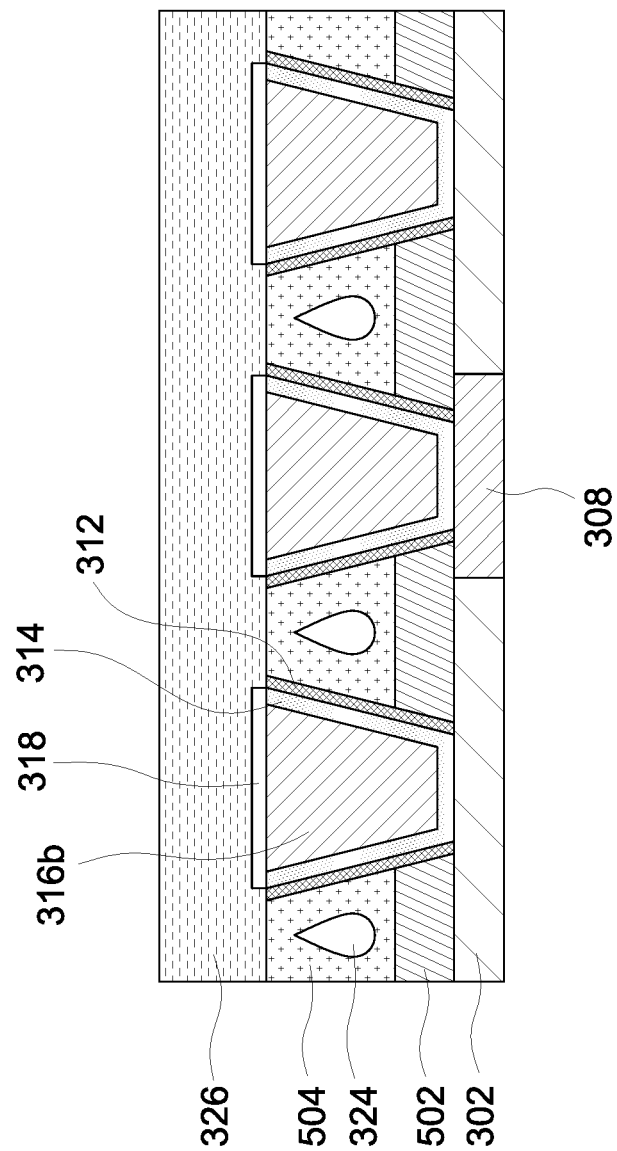

FIGS. 6A to 6B illustrate schematic cross-sectional views of an integrated circuit structure at various stages of fabrication in accordance with some embodiments of the present disclosure.

Refer to FIG. 6A. In some embodiments, after the planarization of the upper dielectric layer 504 and the conductive features 316b as shown in FIG. 5F, a plurality of second cap layers 402 are formed over the conductive features 316b so as to reduce the oxidation of the conductive features 316b as top surfaces of the conductive features 316b are exposed after the planarization. In some embodiments, the second cap layers 402 are selectively formed on the conductive features 316b and the barrier layer 314. In some embodiments, the second cap layer 402 is formed entirely over the integrated circuit structure 500 and then subjected to a patterning process to remove portions of the second cap layer 402 on the upper dielectric layer 504, while leaving another portion of the second cap layer 402 on the conductive features 316b and the barrier layer 314. The second cap layers 402 may be formed by a deposition process such as low-pressure chemical vapor deposition (LPCVD) process, chemical vapor deposition (CVD) process, plasma enhanced chemical vapor deposition (PECVD) process, plasma-enhanced atomic layer deposition (PEALD) process, physical vapor deposition (PVD) process, sputtering, or combinations thereof. In some embodiments, the second cap layers 402 may be metal-containing layers. In some embodiments, the second cap layers 402 may include cobalt, copper, tungsten, aluminum, manganese, ruthenium, combinations thereof, and alloys thereof.

Refer to FIG. 6B. After the second cap layers 402 are formed, an etch stop layer 326 is formed over the dielectric layer 322, the second cap layers 402, the conductive features 316b and the voids 324. In some embodiments, the etch stop layer 326 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. In some embodiments, the integrated circuit structure 600 may further include a plurality of electrical terminals disposed under and electrically connected to one of the plurality of conductive features 316b, wherein the protection layer 312 exposes bottom surfaces of the plurality of conductive features 316b and upper surfaces of the electrical terminals.

Figure 7:
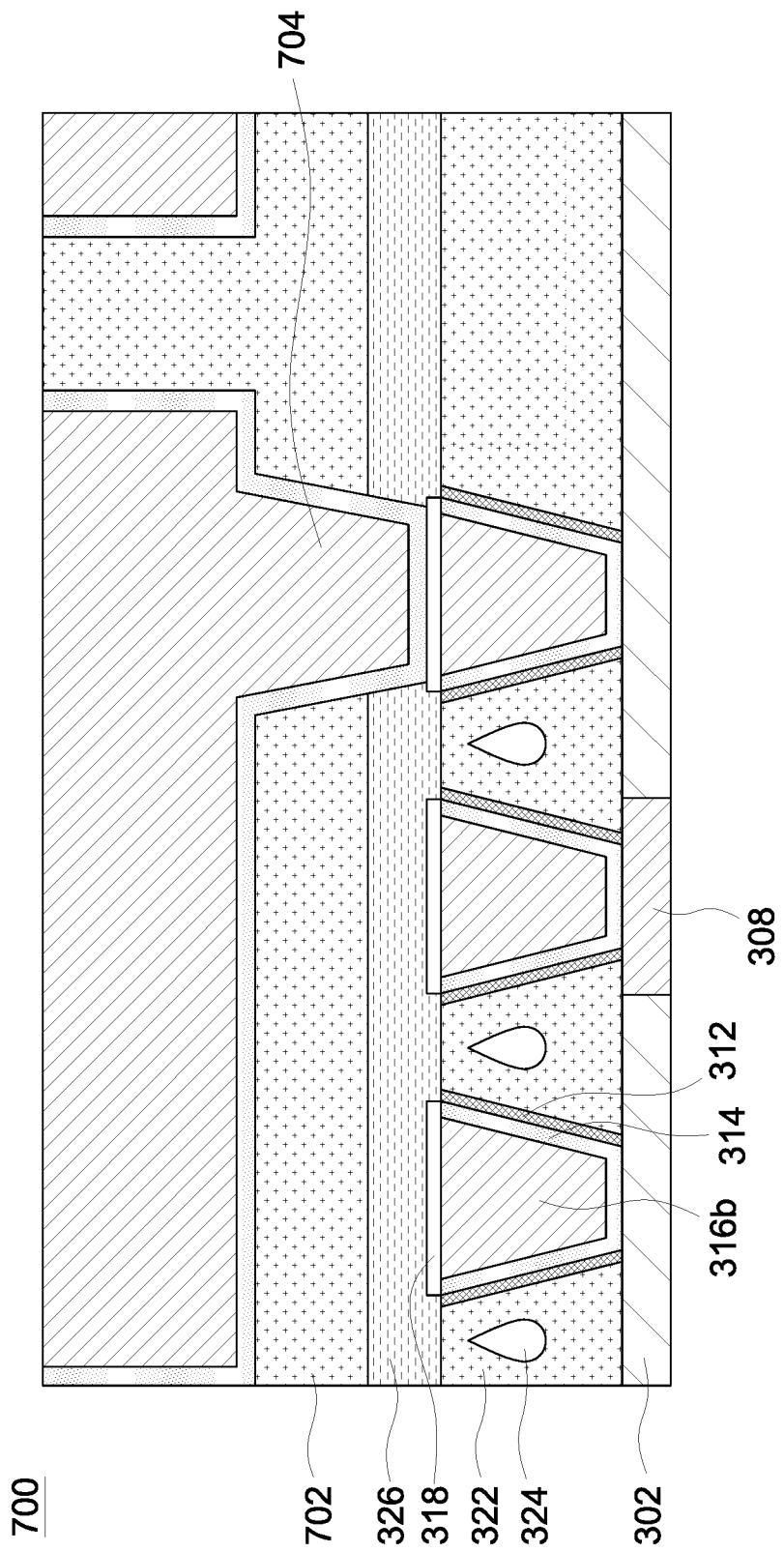
FIG. 7 illustrates a schematic cross-sectional view of an integrated circuit structure in accordance with some embodiments of the present disclosure.

Refer to FIG. 7. FIG. 7 illustrates a schematic cross-sectional view of an integrated circuit structure 700 in accordance with some embodiments of the present disclosure. After the formation of an etch stop layer 326 over the dielectric layer 322 and the second cap layers 402 as shown in FIG. 6B, an inter-metal dielectric (IMD) 702 is formed on the etch stop layer 326. In some embodiments, the inter-metal dielectric (IMD) 702 may be formed of oxides such as silicon oxide, BPSG, USG, FSG, low-k dielectrics such as carbon doped oxides, extremely low-k dielectrics such as porous carbon doped silicon dioxide, a polymer such as polyimide, or a combination thereof. In some embodiments, the low-k dielectric materials may have k values lower than 3.9. In some embodiments, the inter-metal dielectric (IMD) 702 may be formed by a deposition process such as chemical vapor deposition (CVD), physical vapor deposition (PVD), plasma-enhanced CVD (PECVD), atomic layer deposition (ALD), a spin-on-dielectric (SOD) process, or a combination thereof. In some embodiments, a portion of the IMD 702 is removed to form a plurality of via holes stopping at the second cap layers 318. In some embodiments, the portion of the IMD 702 is removed by photolithographic masking process to define the patterns of the via holes, and a selective etching process for selectively removing the dielectric material of the IMD 702 and a portion of the etch stop layer 326, and stops at the second cap layers 318. In some embodiments, the etching process may include wet etching process and dry etching process. A plurality of conductive vias 704 are formed through the IMD 702 and the etch stop layer 326, and electrically connected to the plurality of conductive features 316b. In some embodiments, the conductive vias 704 are formed in the IMD 702 by forming a conductive material within the via holes by a deposition process such as physical vapor deposition (PVD) process, electrochemical plating process (ECP), chemical vapor deposition (CVD) process, and atomic layer deposition process. In some embodiments, the integrated circuit structure 700 may further include a plurality of electrical terminals disposed under and electrically connected to one of the plurality of conductive features 316b, wherein the protection layer 312 exposes bottom surfaces of the plurality of conductive features 316b and upper surfaces of the electrical terminals.

Figure 8:
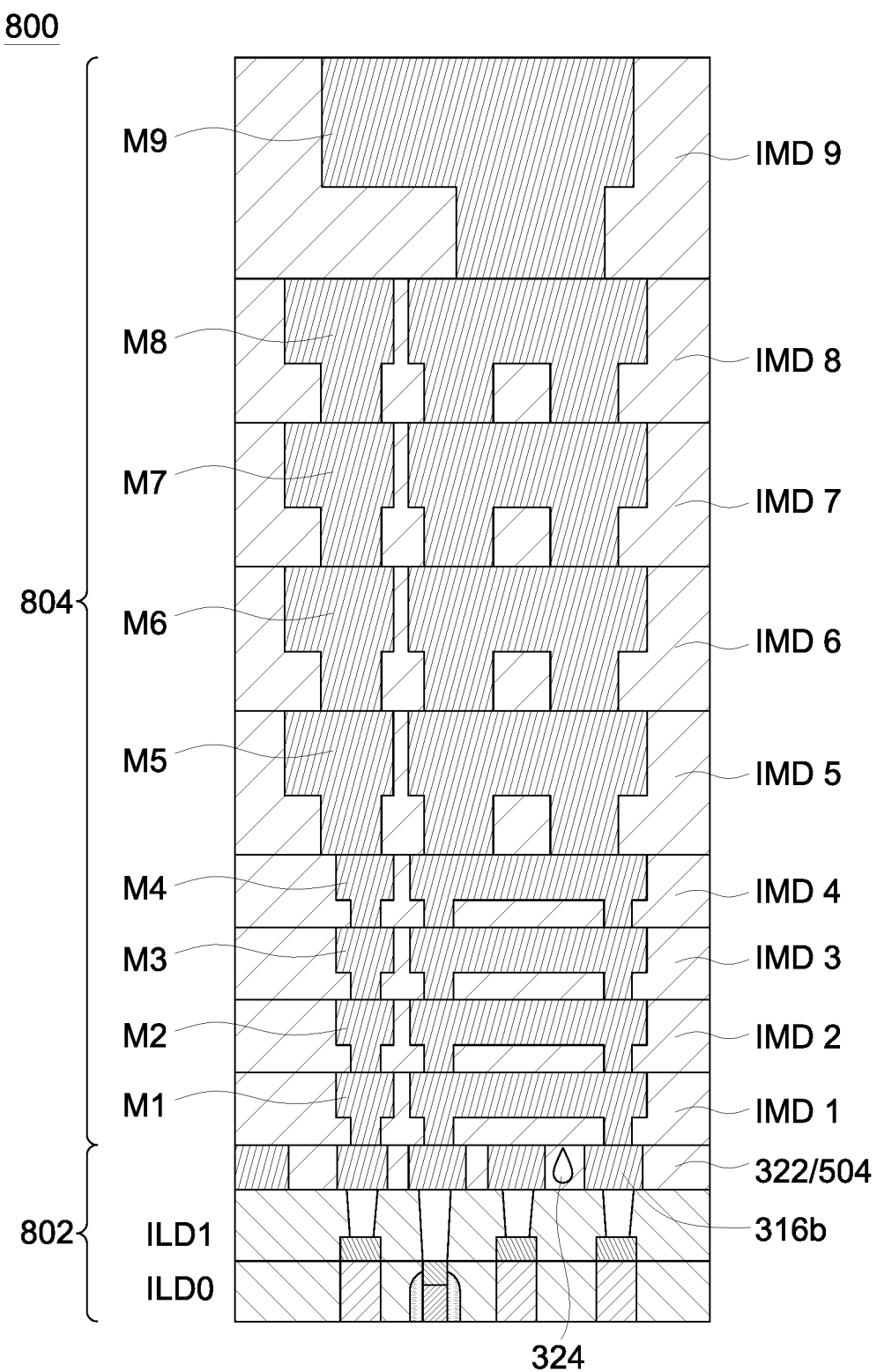
FIG. 8 illustrates a schematic cross-sectional view of an integrated circuit structure in accordance with some embodiments of the present disclosure.

Refer to FIG. 8. FIG. 8 illustrates a schematic cross-sectional view illustrating an integrated circuit device 800 in accordance with some embodiments of the present disclosure. The semiconductor device 800 may have an integrated circuit structure 802 and an interconnect structure 804. Many aspects of the integrated circuit structure 802 may be similar to the integrated circuit structures 300, 400, 500, 600 and 700, and are hereby omitted from discussion for brevity. In the integrated circuit structure 802 fabricated by the method of the present disclosure, with the use of a protection layer, damages to the conductive features during the removal of the dummy layer between the conductive features are alleviated. In addition, as the voids/air gaps between the conductive features in the integrated circuit structure 802 are formed prior to the formation of an etch stop layer over the conductive features and the voids/air gaps in the integrated circuit structure 802, further photolithographic masking and etching operations to the integrated circuit structure 802 are unnecessary. Therefore, further damage to the conductive features and the voids/air gaps of the lower layer are alleviated with the formation of the etch stop layer for the formation of the upper inter-metal dielectric layer. The aforementioned contributes to the stability of the overall electrical performance of the integrated circuit device 800.

In some embodiments, the interconnect structure 804 includes a plurality of conductive layers labeled M1 through M9. Further, the conductive layers M1 through M9 are disposed in a plurality of inter-metal dielectric layers labeled IMD1 through IMD9. The inter-metal dielectric layers IMD1 through IMD9 may provide electrical insulation as well as structural support for the various features during subsequent fabrication operations. In some embodiments, the conductive layers M1 through M9 may include a metallic material such as copper, aluminum, tungsten, or other suitable metals. In some embodiments, the metallic material may include copper or copper alloy, such as copper magnesium, copper aluminum, copper silicon tungsten, and aluminum;copper (AlCu). In some embodiments, the inter-metal dielectric layers IMD1 through IMD9 may be formed of low-κ dielectric material. In some embodiments, the inter-metal dielectric layers IMD1 through IMD9 may include spin-on dielectric (SOD), phosphor-silicate glass (PSG), or the like.

In some embodiments, the inter-layer dielectric layer ILD1 may include conductive vias, such as gate via VG, drain via VD, and conductive via VO. In some embodiments, the gate via VG may be disposed over the contact layer (not shown) of the semiconductor structure 802. In some embodiments, the gate via VG directly contacts the contact layer of the integrated circuit structure 802. The inter-layer dielectric layer ILD1 may provide electrical insulation as well as structural support for the various features during subsequent fabrication operations. In some embodiments, the inter-layer dielectric layer ILD1 may be formed of low-K dielectric material. In some embodiments, the inter-layer dielectric layer ILD1 may include spin-on dielectric (SOD), phosphor-silicate glass (PSG), or the like.

Accordingly, the present disclosure therefore provides a method for fabricating an integrated circuit structure with voids/air gaps which provides well protection to the conductive features and optional barrier layers surrounding the conductive features during the formation of the voids/air gaps. With the use of a protection layer, damages to the conductive features during the removal of the dummy layer between the conductive features, are alleviated. In some embodiments, as the voids/air gaps between the conductive features in a lower layer of an integrated circuit structure are formed prior to the formation of an etch stop layer over the conductive features and the voids/air gaps of the lower layer, further photolithographic masking and etching operations to the lower layer are unnecessary. Therefore, further damage to the conductive features and the voids/air gaps of the lower layer are alleviated with the formation of the etch stop layer for the formation of the upper layer(s) of the integrated circuit structure.

In some embodiments, an integrated circuit structure is provided. The integrated circuit structure includes a plurality of conductive features within a dielectric layer overlying a substrate, a barrier layer disposed between each of the plurality of the conductive features and the dielectric layer, a protection layer between sidewalls of the barrier layer and the dielectric layer and a void disposed within the dielectric layer at a position between two adjacent conductive features of the plurality of the conductive features.

In some embodiments, a method for fabricating an integrated circuit structure is provided. The method includes following operations. A plurality of first openings are formed in a dummy layer over a substrate. A protection layer is formed along sidewalls of the plurality of the first openings. A plurality of conductive features are formed in the plurality of the first openings, respectively. The dummy layer is removed to form a plurality of second openings. A dielectric layer having a void between two adjacent conductive features of the plurality of conductive features are formed.

In some embodiments, a method for fabricating an integrated circuit structure is provided. A plurality of first openings are formed in a dummy layer over a substrate. A plurality of conductive features are formed in the plurality of first openings. At least a portion of the dummy layer is removed to form a plurality of second openings. A dielectric layer covering the plurality of conductive features and filling in the plurality of the second openings with an air gap between two adjacent conductive features of the plurality of conductive features is formed. A top portion of the plurality of the conductive features and a top portion of the upper dielectric layer is removed for planarization.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure, comprising:
   a plurality of conductive features within a dielectric layer overlying a substrate;
   a barrier layer disposed between each of the plurality of the conductive features and the dielectric layer;
   a protection layer between sidewalls of the barrier layer and the dielectric layer; and
   a void disposed within the dielectric layer at a position between two adjacent conductive features of the plurality of the conductive features,
   wherein an upper surface of the dielectric layer is substantially flushed with upper surfaces of the conductive features.

2. The integrated circuit structure of claim 1, further comprising a plurality of cap layers disposed on the plurality of the conductive features, respectively.

3. The integrated circuit structure of claim 2, wherein the plurality of the cap layers are further disposed on at least a portion of the barrier layer.

4. The integrated circuit structure of claim 1, further comprising an etch stop layer disposed over the dielectric layer and the void formed.

5. The integrated circuit structure of claim 4, wherein the etch stop layer is further disposed over the protection layer.

6. The integrated circuit structure of claim 4, further comprising:
   an inter-metal dielectric (IMD) on the etch stop layer; and a plurality of conductive vias through the IMD and the etch stop layer, and electrically connected to the plurality of conductive features, respectively.

7. The integrated circuit structure of claim 1, wherein the dielectric layer comprises a lower dielectric layer, and an upper dielectric layer stacked on the lower dielectric layer.

8. The integrated circuit structure of claim 6, wherein the void is formed within the upper dielectric layer.

9. The integrated circuit structure of claim 1, further comprising a plurality of electrical terminals disposed under and electrically connected to one of the plurality of conductive features, wherein the protection layer exposes bottom surfaces of the plurality of conductive features and upper surfaces of the electrical terminals.

10. A method for fabricating an integrated circuit structure, comprising:
   forming a plurality of first openings in a dummy layer over a substrate;
   forming a protection layer along sidewalls of the plurality of the first openings;
   forming a barrier layer over the plurality of the first openings;
   forming a plurality of conductive features in the plurality of the first openings, respectively, after the forming of the barrier layer;
   removing the dummy layer to form a plurality of second openings; and
   forming a dielectric layer having a void between two adjacent conductive features of the plurality of conductive features.

11. The method of claim 10, wherein the substrate comprises at least a conductive via.

12. The method of claim 11, wherein the conductive via is contact with barrier layer.

13. The method of claim 10, further comprising:
   forming a plurality of first cap layers on the plurality of conductive features, respectively, prior to removing the dummy layer;
   removing the first cap layers, a top portion of the plurality of the conductive features and a top portion of the dielectric layer for planarization; and
   forming a plurality of second cap layers on the plurality of conductive features respectively subsequent to removing the first cap layers, a top portion of the plurality of the conductive features and a top portion of the dielectric layer.

14. The method of claim 13, further comprising:
   forming an etch stop layer on the second cap layers and the dielectric layer having the void;
   forming an inter-metal dielectric (IMD) on the etch stop layer;
   etching the IMD to form a plurality of via holes stopping at the second cap layers, respectively; and
   forming a plurality of conductive vias in the IMD.

15. A method for fabricating an integrated circuit structure, comprising:
   forming a plurality of first openings in a dummy layer over a substrate;
   forming a plurality of conductive features in the plurality of first openings;
   removing at least a portion of the dummy layer to form a plurality of second openings;
   forming an upper dielectric layer covering the plurality of conductive features and filling in the plurality of the second openings with an air gap between two adjacent conductive features of the plurality of conductive features; and
   removing a top portion of the plurality of the conductive features and a top portion of the upper dielectric layer for planarization.

16. The method of claim 15, wherein the planarization is carried out by chemical-mechanical polishing.

17. The method of claim 15, further comprising forming a protection layer along sidewalls of the plurality of the first openings.

18. The method of claim 17, further comprising forming a barrier layer between the conductive features and the protection layer subsequent to forming the protection layer.

19. The method of claim 15, wherein the dummy layer comprises stack of a bottom layer and an upper layer, and removing at least a portion of the dummy layer comprises removing the upper layer, and the upper dielectric layer is formed on the bottom layer in the second openings.

20. The method of claim 15, further comprising forming a plurality of cap layers on the plurality of the conductive features, respectively, subsequent to removing the top portion of the plurality of the conductive features and the top portion of the dielectric layer for planarization.

* * * * *